(12) United States Patent
Kutter et al.

(10) Patent No.: US 11,486,381 B2
(45) Date of Patent: Nov. 1, 2022

(54) COMBINED PUMP-SENSOR ARRANGEMENT

(71) Applicant: Fraunhofer-Gesellschaft zur Foerderung der angewandten Forschung e.V., Munich (DE)

(72) Inventors: Christoph Kutter, Munich (DE); Yuecel Congar, Munich (DE); Siegfried Roehl, Munich (DE); Martin Richter, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 86 days.

(21) Appl. No.: 16/795,542

(22) Filed: Feb. 19, 2020

(65) Prior Publication Data

US 2020/0277948 A1 Sep. 3, 2020

(30) Foreign Application Priority Data

Feb. 28, 2019 (DE) ...................... 10 2019 202 722.9

(51) Int. Cl.
*F04B 43/04* (2006.01)
*G01N 1/24* (2006.01)

(52) U.S. Cl.
CPC ............. *F04B 43/046* (2013.01); *G01N 1/24* (2013.01); *B81B 2201/036* (2013.01); *F04B 2205/501* (2013.01)

(58) Field of Classification Search
CPC .... F04B 43/046; F04B 2205/501; G01N 1/24
See application file for complete search history.

(56) References Cited

U.S. PATENT DOCUMENTS

| 6,548,895 B1 * | 4/2003 | Benavides ............ H01L 23/473 257/712 |
| 8,631,813 B2 | 1/2014 | Ehrenpfordt et al. |
| 9,101,929 B2 * | 8/2015 | Ehrenpfordt .......... B01L 3/5027 |
| 2008/0017306 A1 | 1/2008 | Liu et al. |

(Continued)

FOREIGN PATENT DOCUMENTS

| DE | 102010002990 A1 | 9/2011 |
| DE | 102010038445 A1 | 2/2012 |

(Continued)

*Primary Examiner* — Connor J Tremarche
(74) *Attorney, Agent, or Firm* — Perkins Coie LLP; Michael A. Glenn

(57) ABSTRACT

The invention relates to a combined pump-sensor arrangement having a substrate having a first main surface and an opposite second main surface. A package lid which defines a package having a measuring cavity is arranged on the first main surface of the substrate. Additionally, the pump-sensor arrangement has a micropump having a pump inlet and a pump outlet, the micropump being configured to suck in an analyte fluid present in the measuring cavity through the pump inlet and eject the same to an environment outside the measuring cavity via the pump outlet. Furthermore, the pump-sensor arrangement has a sensor for detecting at least one component of the analyte fluid present within the measuring cavity and movable by means of the micropump. In accordance with the invention, both the sensor and the micropump are commonly arranged on the first main surface of the substrate and within the measuring cavity.

15 Claims, 5 Drawing Sheets

(56) References Cited

U.S. PATENT DOCUMENTS

2014/0227147 A1 8/2014 Beyer et al.
2016/0169704 A1* 6/2016 Badeja .................. G01D 3/036
                 73/866.1

FOREIGN PATENT DOCUMENTS

EP    3457433 A1  3/2019
WO   2018013109 A1  1/2018

* cited by examiner

COMBINED PUMP-SENSOR ARRANGEMENT

CROSS-REFERENCE TO RELATED APPLICATIONS

This application claims priority from German Application No. 10 2019 202 722.9, which was filed on Feb. 28, 2019, and is incorporated herein by reference in its entirety.

BACKGROUND OF THE INVENTION

The invention relates to a combined pump-sensor arrangement in which a micropump and a sensor are commonly integrated in a package, and particularly to a concept for miniaturizing pump-assisted sensors in a common package.

Nowadays, a plurality of different sensors for detecting various analytes are known. Among these are, for example, gas sensors, humidity sensors, fine dust sensors and many more, wherein nowadays particular emphasis is placed on the portability of such sensors. Equipping portable communication devices, like smartphones, wearables and the like, with such sensors is an example of what is strived for nowadays. Here, the sensors are to be as small as possible.

For miniaturization purposes, conventional sensors can be operated by means of diffusion. Here, the sensors are arranged in a sensor package, the sensor package comprising openings through which the medium to be measured (i.e. the analyte) can diffuse into the sensor package by means of diffusion. Natural diffusion of the analyte from an environment into the sensor package, however, may partly take a very long time, which is why this is not satisfactory, in particular in the case of measurements the results of which are to be readily available.

The slow diffusion may be replaced by faster convection. Here, usually pumps are provided which pump the analyte into the senor package and towards the sensor. When using pumps in connection with one or several gas sensors or fine dust sensors so as to convey the analyte to and drain the same from the sensor faster than takes place by natural diffusion, known conventional solutions need the pump and the sensors as well as the gas channels and electrical terminals to be arranged suitably. In this regard, the known technology provides for sensors and the pump to be connected by connectors, tubes and/or capillaries. However, such arrangements are too big and too expensive so that these cannot be integrated into smartphones or similar portable applications.

Consequently, it would be desirable to improve existing sensor devices in that measuring results are readily available and, at the same time, the packages of the sensor devices can be manufactured to be as small as possible, and cheaply.

SUMMARY

According to an embodiment, a combined pump-sensor arrangement may have: a substrate having a first main surface and an opposite second main surface, a package lid, arranged on the first main surface of the substrate, defining a package having a measuring cavity, a micropump having a pump inlet and a pump outlet, the micropump being configured to suck in an analyte fluid present in the measuring cavity through the pump inlet and eject the same to an environment outside the measuring cavity via the pump outlet, a sensor for detecting at least one component of the analyte fluid present within the measuring cavity and movable by means of the micropump, wherein both the sensor and the micropump are arranged on the first main surface of the substrate and within the measuring cavity.

The inventive combined pump-sensor arrangement comprises a substrate comprising a first main surface and an opposite second main surface. A package lid which defines a package comprising a measuring cavity is arranged on the first main surface of the substrate. This means that the space or volume within the package defines the measuring cavity. The measuring cavity is a cavity into which an analyte present in the environment, advantageously a fluid, can flow so that the analyte is then located within the cavity or measuring cavity. The combined pump-sensor arrangement additionally comprises a micropump comprising a pump inlet and a pump outlet. The micropump is configured to suck in an analyte fluid present in the measuring cavity through the pump inlet and to eject the same again into the environment outside the measuring cavity via the pump outlet. The combined pump-sensor arrangement additionally comprises a sensor for detecting at least one component of the analyte fluid present within the measuring cavity and movable by means of the micropump. The analyte fluid may, for example, be environmental air and a component of the analyte fluid may, for example, by nitrogen dioxide $NO_2$. The sensor reacts to this component of the analyte fluid and correspondingly is configured to detect this at least one component of the analyte fluid and, optionally, to determine its volume share in the analyte fluid. In accordance with the invention, both the sensor and the micropump are arranged on the first main surface of the substrate and within the package lid. This means that, in the inventive combined pump-sensor arrangement, the micropump is integrated directly into the sensor package.

BRIEF DESCRIPTION OF THE DRAWINGS

Some embodiments are illustrated exemplarily in the Figure and will be explained below, in which.

DETAILED DESCRIPTION OF THE INVENTION

Figure 1:
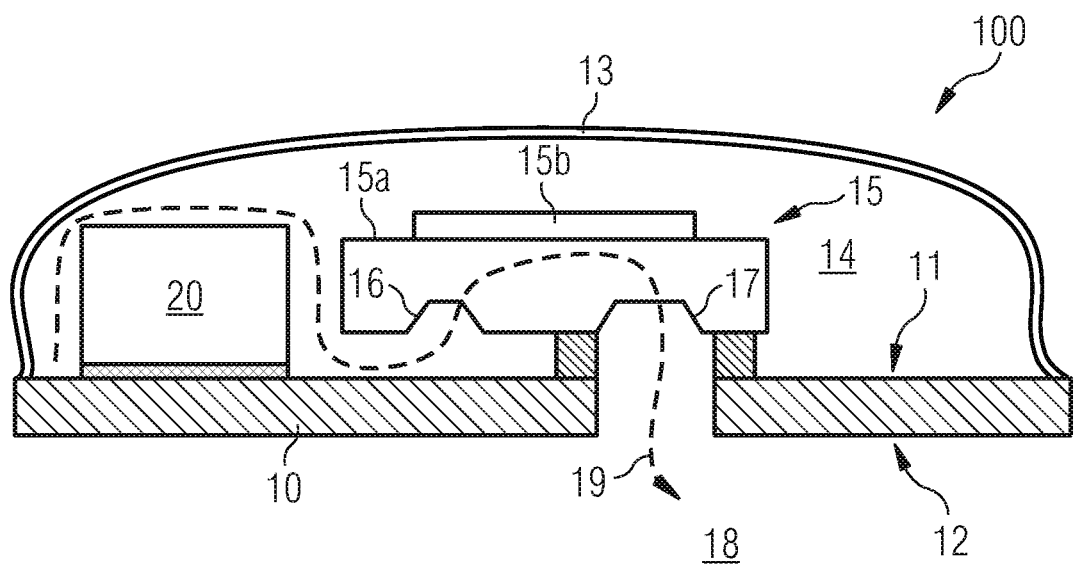
FIG. 1 is a schematic sectional side view of a combined pump-sensor arrangement in accordance with an embodiment.

Subsequently, embodiments will be described in greater detail referring to the figures, wherein elements having the same or similar functions are provided with same reference numerals.

A gas sensor is partly described as a non-limiting example of a sensor. However, the sensor may principally be any other sensor, like a liquid sensor or solid sensor, for example. In addition, gas is described as a non-limiting example of a fluid. However, the fluid may also be liquids. Additionally, fine dust is mentioned as a non-limiting example of a component of the analyte fluid. However, it is to be understood that other components of the analyte fluid, like certain individual gas components in a gas mixture or volatile organic compounds VOC, for example, may also be components of the analyte fluid.

FIG. 1 shows an example of a combined pump-sensor arrangement 100. The combined pump-sensor arrangement 100 comprises a substrate 10 comprising a first main surface 11 and an opposite second main surface 12. The substrate 10 may, for example, be implemented as a PCB (printed circuit board) or as an at least partly flexible foil substrate.

A package lid 13 advantageously implemented as a cap is arranged on the first main surface 11 of the substrate 10. In combination with the underlying substrate 10, the package lid 13 defines a package having a measuring cavity 14.

Furthermore, the combined pump-sensor arrangement 100 comprises a micropump 15. The micropump 15 may comprise delivery rates in the range of some milliliters per minute. The micropump 15 may, for example, be implemented to be a MEMS (micro-electromechanical system) micropump. In some embodiments, the micropump 15 may comprise lateral dimensions of 4×4 $mm^2$ or less.

The micropump 15 may exemplarily be a semiconductor micropump, like a silicon micropump, the pump body 15a of which basically consists of a corresponding semiconductor material. Additionally, the micropump 15 may be implemented to be a membrane pump, wherein a membrane arranged to be moveable at the pump body 15a can provide a pump actuating effect by means of suitable deflection. The membrane may exemplarily be moved by means of a piezo element 15b.

The micropump 15 comprises a pump inlet 16 and a pump outlet 17. The micropump 15 is configured to suck in an analyte fluid present in the measuring cavity 14 through the pump inlet 16 and eject the same to an environment 18 outside the measuring cavity 14 via the pump outlet 17. This is illustrated exemplarily using the dashed arrow 19 which symbolizes the path of the analyte fluid moving through the measuring cavity 14 with an activated micropump 15.

Thus, at least a part of the moving analyte fluid flows past a sensor 20. The sensor 20 is configured to detect at least one component of the analyte fluid present within the measuring cavity 14 and movable by means of the micropump. The analyte fluid present in the measuring cavity 14 may, for example, be a gas to be analyzed or to be detected, wherein the sensor 20 may correspondingly be configured to be a gas sensor.

In accordance with the invention, both the sensor 20 and the micropump 15 are arranged on the first main surface 11 of the substrate 10 and within the package lid 13. This allows realizing a particularly compact arrangement of the micropump 15 and the sensor 20 within the combined pump-sensor arrangement 100.

Advantageously, the micropump 15 can be arranged on the first main surface 11 of the substrate 10 without any support. This means that the micropump 15 is not arranged on a separate substrate, like a support board or a PCB (printed circuit board), for example, which in turn would be arranged on the actual substrate 10 of the combined pump-sensor arrangement 100. Instead, the micropump 15 is arranged directly on the substrate 10. An exemplary embodiment provides for the micropump 15 to be soldered or glued directly onto the substrate 10. When placing the micropump 15 directly on the substrate 10, approximately 150 µm and more can be saved in terms of height by omitting an additional support.

Alternatively or additionally, the micropump 15 can be implemented without any tubes. As mentioned before, tubes and other fluid conductors are provided in the known technology in order to connect a pump to a sensor such that a fluid can be guided past the sensor. However, the fluid conductors use a lot of space, which counteracts the miniaturization strived for. The micropump 15 employed in the inventive pump-sensor arrangement 100, however, may be implemented without tubes or fluid conductors, thereby saving space and allowing corresponding miniaturization.

Figure 2:
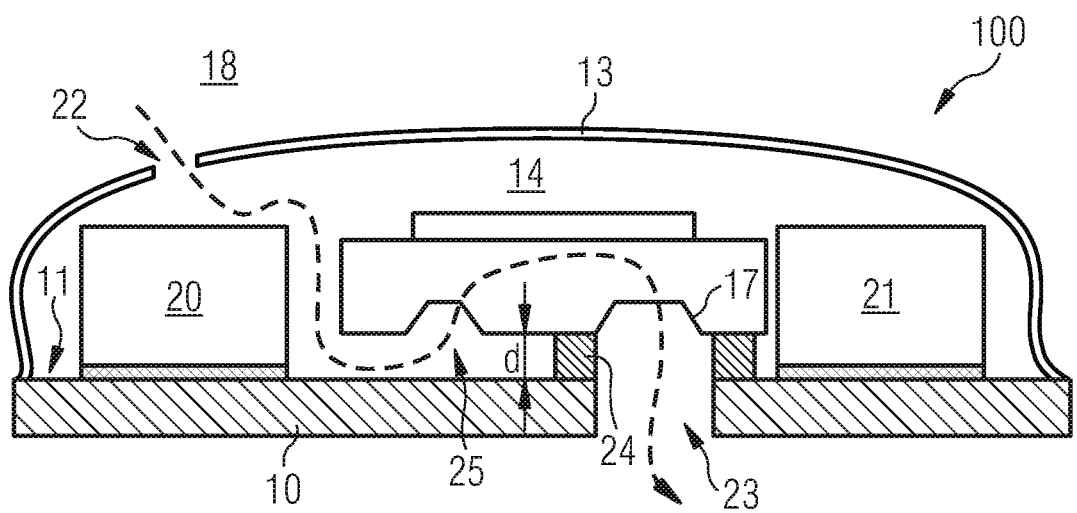
FIG. 2 is a schematic sectional side view of a combined pump-sensor arrangement in accordance with another embodiment.

FIG. 2 shows another example of a combined pump-sensor arrangement 100. In addition to the example as shown in FIG. 1, the package lid 13 may comprise an opening 22 which defines a fluid inlet through which the analyte fluid can flow into the measuring cavity 14 from the environment 18, wherein the opening 22 is arranged opposite the sensor 20. This is of advantage in that the analyte fluid flows into the measuring cavity 14 by means of the convection generated by the micropump 15, which, when compared to natural diffusion, is considerably faster. The analyte fluid is really sucked into the measuring cavity 14 through the fluid inlet opening 22. Since the opening 22 is arranged opposite the sensor 20, the analyte fluid sucked in thus advantageously flows past the senor 20 without considerable detours.

The package lid 13 with the opening 22 provided therein may be, for example, a so-called open cavity lid or open metal lid. Exemplarily, the package lid 13 may comprise a metal. Alternatively, the package lid 13 may comprise plastic and, optionally, comprise a metallization on its inner side. Alternatively, the package lid 13 may be present as a plastic package manufactured by means of molding, wherein this variation is also referred to as open cavity molded package.

Advantageously, the packet lid 13 can be arranged on the first main surface 11 of the substrate 10 in a fluid-tight manner. Thus, with an activity of the micropump 15, no leaked air is sucked in through potential leakages in the connective region between the package lid 13 and the substrate 10. The delivery rate of the micropump 15 is thus focused primarily on sucking in the analyte fluid from the environment 18 into the measuring cavity 14 through the fluid inlet opening 22.

The substrate 10 may comprise an opening 23 which defines a fluid outlet. The analyte fluid ejected from the pump outlet 17 by the micropump 15 can thus be ejected back into the environment 18 from the measuring cavity 14 through this fluid outlet opening 23. The outlet opening 23 formed in the substrate 10 can be connected or coupled to the pump outlet 17 fluidically and, advantageously, in a fluid-tight manner.

As is also indicated exemplarily in FIG. 2, another component 21 can be provided. The further component 21 may, for example, comprise a further sensor and/or an electronic circuit. The electronic circuit 21 may, for example, comprise electronics for driving and/or reading out the sensor 20 and/or generating an operating voltage of the micropump 15. The electronic circuit 21 may, for example, comprise an ASIC (application specific integrated circuit).

As has been mentioned before, the micropump 15 can be arranged on the substrate 10 without any support. In the embodiment illustrated here, the micropump 15 can be attached to be spaced apart from the first main surface 11 of the substrate 10 by means of a spacer 24 so that a fluid channel 25 results between the micropump 15 and the first main surface 11 of the substrate 10, the fluid channel extending laterally between the measuring cavity 14 and the pump inlet 16 and fluidically connecting the measuring cavity 14 and the pump inlet 16. The analyte fluid can be sucked in through the fluid channel 25.

The spacer 24 may, as is exemplarily illustrated in FIG. 2, be arranged around the fluid outlet opening 23, for example. Alternatively or additionally, several spacers can be provided by means of which the micropump 15 is arranged to be spaced apart from the first main surface 11 of the substrate 10.

Due to this spaced arrangement, the result is the fluid channel 25 mentioned before between the first main surface 11 of the substrate 10 and the lower side (that side facing the first main surface 11 of the substrate 100) of the micropump 15. The measure of spacing, characterized in FIG. 2 by the reference sign d, thus basically corresponds to a height of the fluid channel 25 which in turn can be dependent on the height of the spacer 24. This means that the fluid channel 25 can be defined and dimensioned by means of varying the height of the spacer 24.

Figure 3:
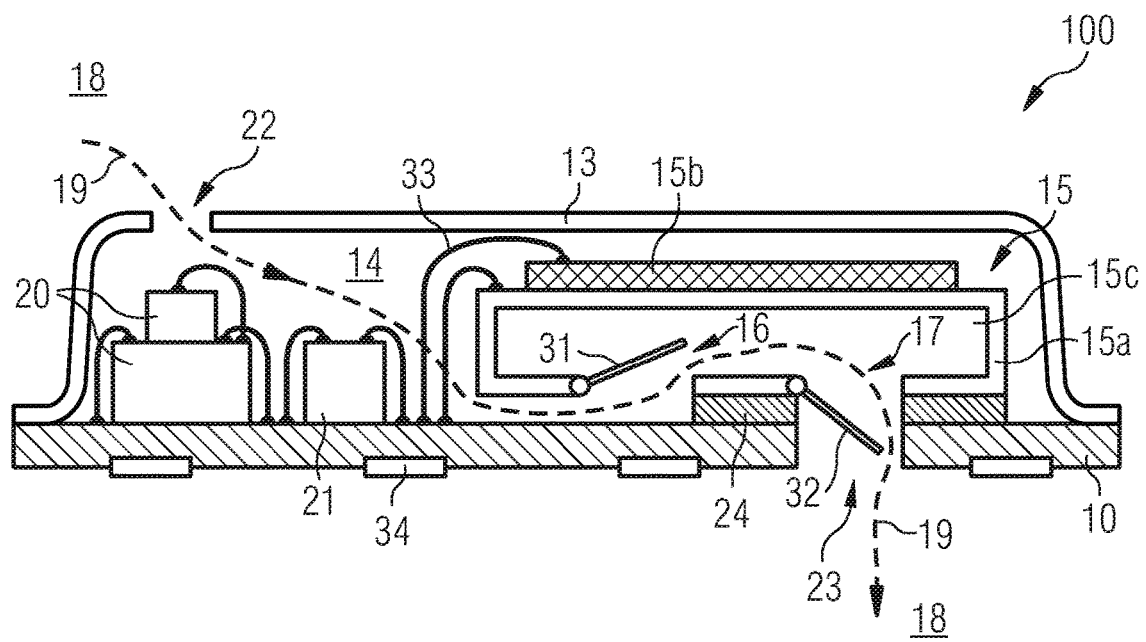
FIG. 3 is a schematic sectional side view of a combined pump-sensor arrangement in accordance with another embodiment.

FIG. 3 shows a somewhat more detailed view of another example of a combined pump-sensor arrangement 100. Here, the path covered by the analyte fluid in the case of an active micropump 15 is indicated and characterized by means of the dashed arrow 19. As can be recognized, the analyte fluid is sucked in from the environment 18 through the fluid inlet opening 22, whereupon the analyte fluid flows into the measuring cavity 14. Within the measuring cavity 14, it flows through the fluid channel 25 to the pump inlet 16 and into the pump chamber 15*c* of the micropump 15. From the pump chamber 15*c*, the sucked analyte fluid flows towards the pump outlet 17 from which it is ejected again to the environment 18 through the fluid outlet opening 23.

The pump inlet 16 may comprise an inlet valve 31. The inlet valve 31 can be a one-way valve which opens in the direction of flow 19 of the analyte fluid and allows the analyte fluid to enter into the pump chamber 15*c* and which blocks fluid from flowing in the opposite direction of the flow direction 19 so as to prevent the analyte fluid from leaving the pump chamber 15*c* opposite to the flow direction 19 indicated.

Alternatively or additionally, the pump outlet 17 may comprise an outlet value 32. The outlet value 32 may be a one-way valve which opens in the flow direction 19 of the analyte fluid and allows the analyte fluid to leave the pump chamber 15*c*, and which blocks fluid from flowing in the opposite direction so as to prevent the analyte fluid from entering from the environment 18 opposite to the flow direction 19 indicated.

Within the measuring cavity 14, the individual elements arranged therein, like the sensor 20 and the micropump 15, for example, and the optional further component 21 (like sensor, circuit) can be connected electrically to the substrate 10. Here, bond wires 33 may, for example, be used. The bond wires 33 may exemplarily be used for contacting the micropump 15 and/or the piezo element 15*b*.

One or several electrical contacts 34 may additionally be provided on the second main surface 12 of the substrate 10. These may serve for externally contacting the elements 15, 20, 21 arranged within the measuring cavity 14, wherein vias (which are not illustrated explicitly) extending through the substrate 10 may, for example, be provided.

Figure 4:
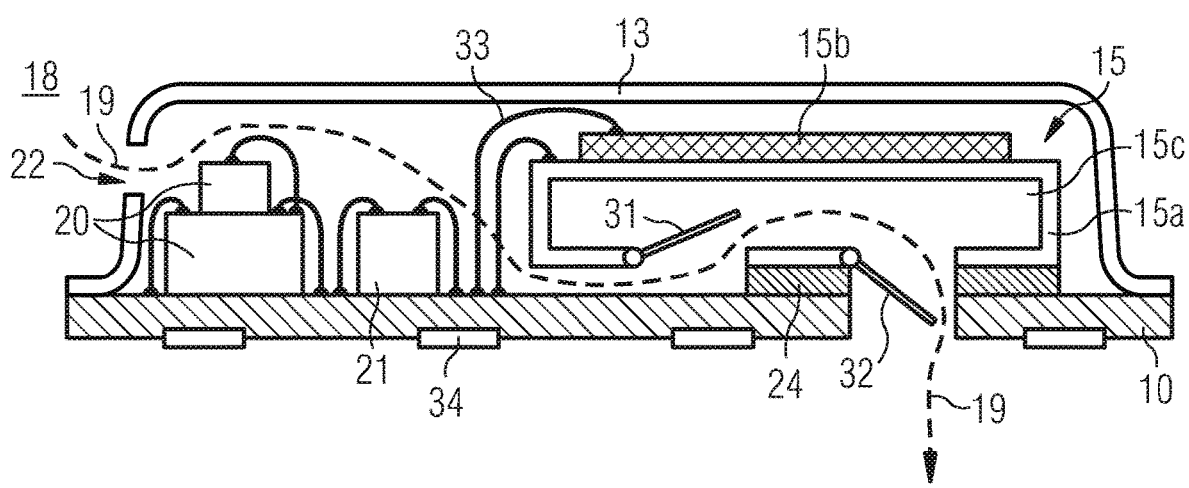
FIG. 4 is a schematic sectional side view of a combined pump-sensor arrangement in accordance with another embodiment.

FIG. 4 shows another example of a combined pump-sensor arrangement 100. This embodiment basically is similar to the embodiment discussed referring to FIG. 3, however with the difference that the opening 22 in the package lid 13 is provided at a different position.

Whereas the opening 22 defining the fluid inlet, in the embodiment shown in FIG. 3, is formed on the upper side (the surface facing away from the substrate 10) of the package lid 13, the opening 22, in the embodiment illustrated in FIG. 4, is arranged at laterally circumferential side walls of the package lid 13. However, in both cases, the respective opening 22 is arranged adjacent to the sensor 20. Thus, the analyte fluid sucked in may flow directly past the sensor 20.

Figure 5:
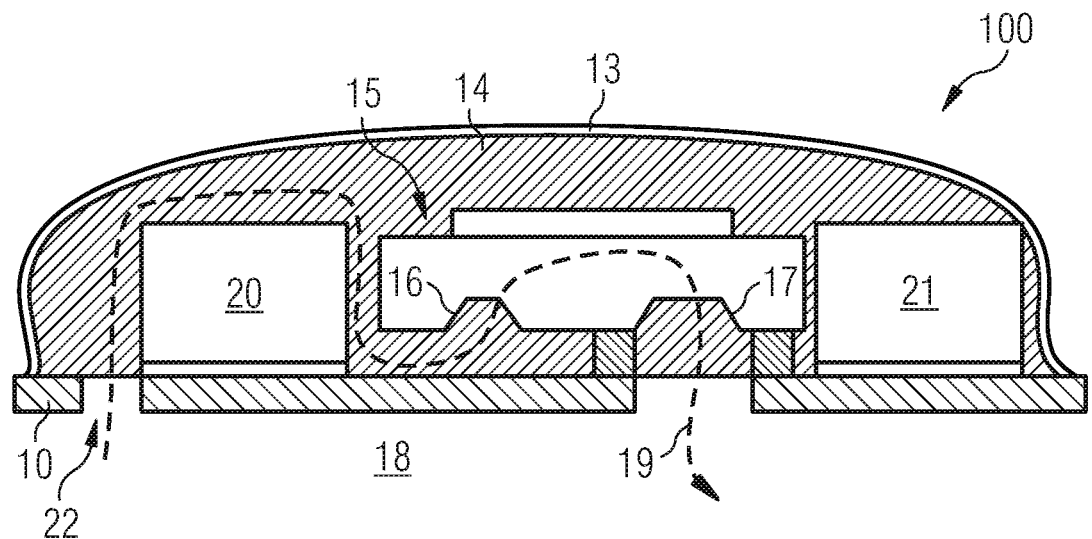
FIG. 5 is a schematic sectional side view of a combined pump-sensor arrangement in accordance with another embodiment.

FIG. 5 shows another example of a combined pump-sensor arrangement 100. Alternatively or in addition to the fluid inlet opening 22 in the package lid 13 as described before, a fluid inlet opening 22 may be provided in the substrate 10.

Here, the substrate 10 exemplarily comprises an opening 22 completely extending through the substrate 10, which defines a fluid inlet through which the analyte fluid can flow into the measuring cavity 14 from the environment 18. The sensor 20 here is arranged, in the fluid flow direction 19, between the fluid inlet 22 and the pump inlet 16. This means that the analyte fluid sucked in advantageously directly flows past the sensor 20 and advantageously completely around the sensor 20. Thus, this embodiment offers an optimally defined fluid guiding and improved ways of connection for the fluid inlet. In addition, no opening is required in the package lid 13 so that the package lid 13 can be arranged on the substrate 10 in a completely fluid-tight manner.

Figure 6:
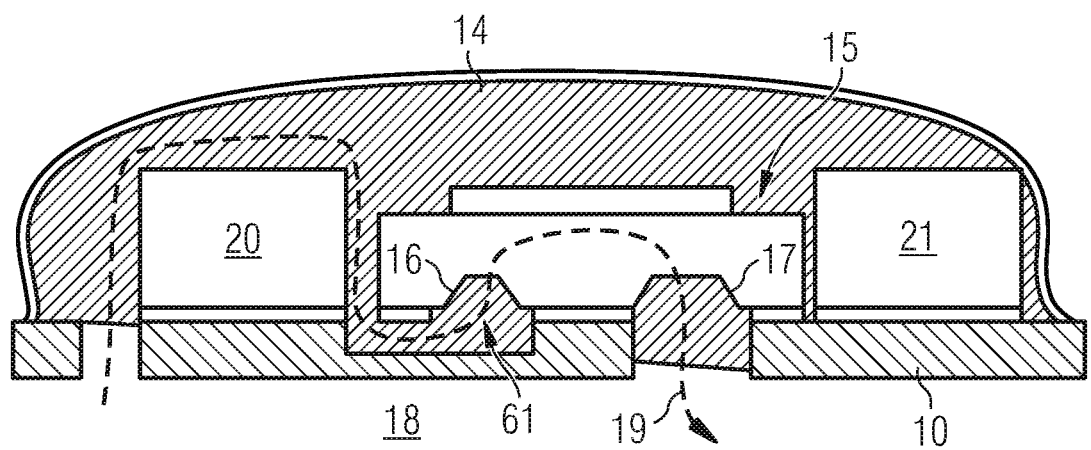
FIG. 6 is a schematic sectional side view of a combined pump-sensor arrangement in accordance with another embodiment.

FIG. 6 shows another example of a combined pump-sensor arrangement 100. Instead of the spacer 24 described before between the substrate 10 and the micropump 15, the pump 15 can be mounted directly on the first main surface 11 of the substrate 10. Here, the same connecting technology can be used as is for mounting the sensor 20 and/or the further component 21. Exemplarily, the micropump 15 may be mounted directly on the substrate 10 by means of an adhesive or a solder connection.

Since the micropump 15 in this embodiment is mounted on the substrate 10 without the spacer 24 mentioned before, the micropump 15 is easier to mount on the substrate 10 since there is no danger of tilting. When omitting the spacer 24, the fluid channel 25 described before, which has resulted from the spatial spacing of the micropump 15 to the first main surface 11 of the substrate 10 is also omitted.

In the embodiment shown in FIG. 6, the substrate 10 may instead comprise a recess 61 arranged in the first main surface 11, the recess defining a fluid channel between the measuring cavity 14 and the pump inlet 16 so that the analyte fluid can be sucked in through this fluid channel 61. This means that the substrate 10 may comprise the recess 61 between the micropump 15 and the first main surface 11 of the substrate 10, advantageously at least between the pump inlet 16 and the first main surface 11 of the substrate 10. The recess 61 here may extend laterally beyond the footprint (outline) of the micropump 15 so that the measuring cavity 14 and the pump inlet 16 are fluidically connected to each other via the recess 61. The recess 61 thus forms a fluid channel between the measuring cavity 14 and the pump inlet 15 through which the analyte fluid can be sucked in.

In this embodiment, the spacer 24 mentioned before can optionally also be present in addition to the recess 61 in the substrate 10. Thus, the fluid channel 25 described referring to FIG. 2 and the fluid channel 61 described referring to FIG. 6 would form a common fluid channel 25, 61. The same could then be defined and dimensioned correspondingly by the height of the spacer 24 and/or the depth of the recess 61.

Figure 7:
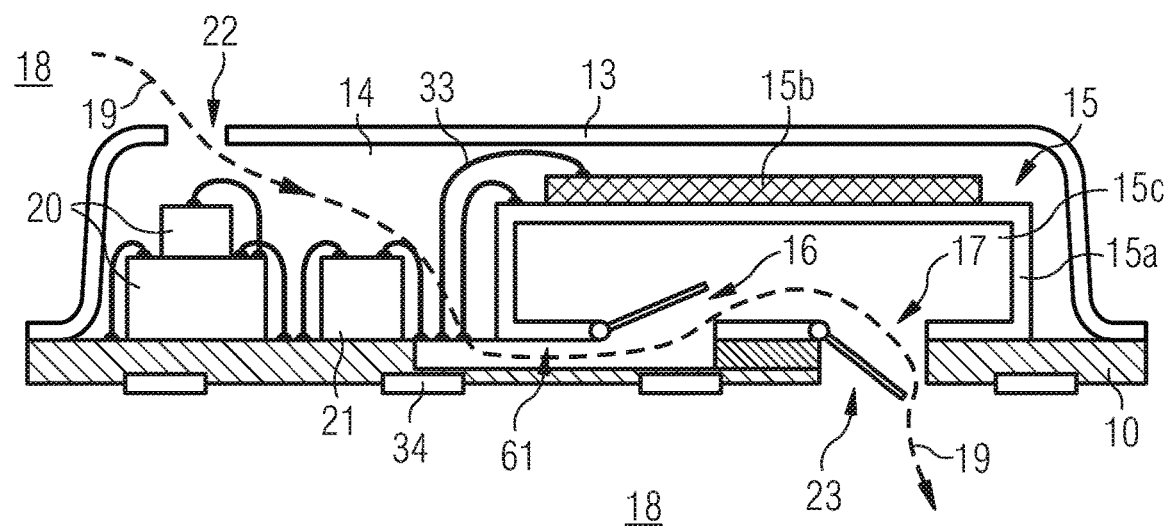
FIG. 7 is a schematic sectional side view of a combined pump-sensor arrangement in accordance with another embodiment.

FIG. 7 shows a more detailed view of the embodiment discussed before referring to FIG. 6. This view basically corresponds to the embodiment illustrated in FIG. 3, however with the difference that the micropump 15 in this case is mounted on the substrate 10 without any spacer. Furthermore, the recess 61 mentioned before, which defines the fluid channel between the measuring cavity 14 and the pump inlet 16 can be recognized in the first main surface 11 of the substrate 10. As is indicated by the dashed arrow 19, the analyte fluid flows from the environment 18 into the measuring cavity 14 through the fluid inlet opening 22, and from there through the fluid channel 61 formed in the substrate 10 through the pump inlet 16 to the pump chamber 15c. From the pump chamber 15c, the analyte fluid flows through the pump outlet 17 and the subsequent fluid outlet opening 23 back to the environment 18.

In all the embodiments described so far, the measuring cavity 14 comprises a so-called dead volume. The dead volume corresponds to that portion of the overall volume of the measuring cavity 14 which has to be delivered by the micropump 15 until the analyte fluid reaches the sensor 16. The higher the measuring cavity 14, the greater the dead volume. However, the smaller the dead volume, the faster the analyte fluid will reach the sensor 16. Thus, it is of advantage to keep the dead volume within the measuring cavity 14 as small as possible.

Figure 8:
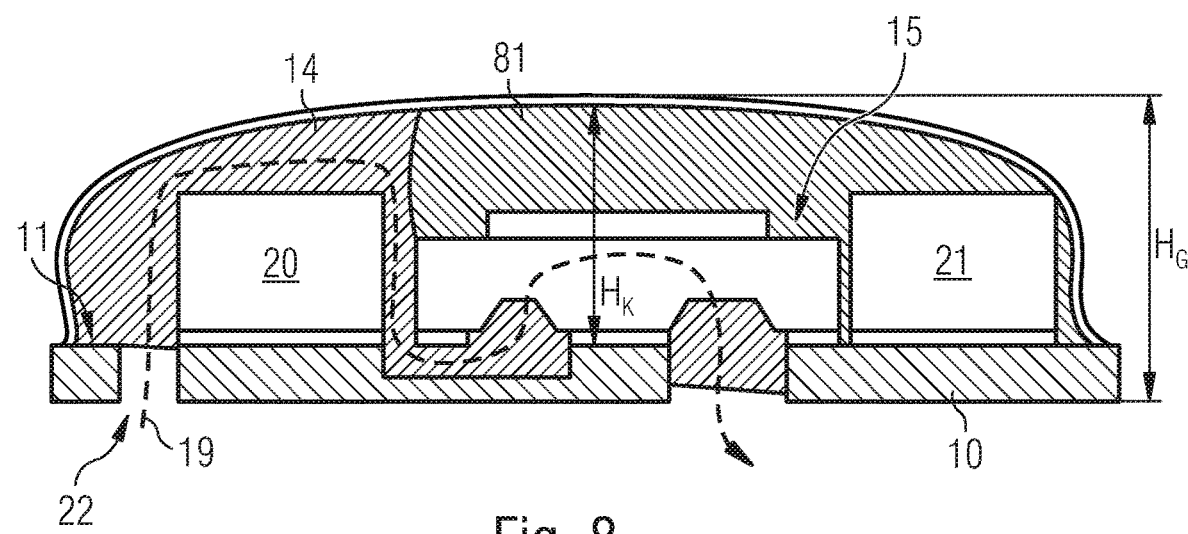
FIG. 8 is a schematic sectional side view of a combined pump-sensor arrangement in accordance with another embodiment.

FIG. 8 shows an example of a combined pump-sensor arrangement 10 in which the dead volume within the measuring cavity 14 is reduced when compared to the embodiments discussed so far. As can be recognized, a filling material 81 can be arranged within the measuring cavity 14. The filling material 81 fills a part of the overall volume of the measuring cavity 14 so that the remaining volume where the analyte fluid may propagate is reduced by the portion of the filling material 81. In other words, the portion of the measuring cavity 14 where the analyte fluid may propagate is reduced.

The filling material 81 may be implemented to be solid so that the analyte fluid cannot diffuse through the filling material 81. The filling material 81 may, for example, comprise a casting compound containing plastic. The filling material 81 may cover, for example, the micropump 15 and/or the optional further component 21 at least in sections and, advantageously, completely, as is illustrated in FIG. 8. In some embodiments, the filling material 81 may cover the measuring cavity 14 completely, at least with the exception of a fluid flow path between an active sensor area of the sensor 20 and the pump inlet 16. Generally, the fluid flow path within the package is to be minimized as far as possible by means of the filling material.

The filling material 81 may comprise flexible characteristics so that the pump membrane of the micropump 15 remains deflectable despite the filling material 81 arranged above it. Additionally, the filling material 81 is to exhibit characteristics which do not influence the sensor measurement, no sponge effects, no outgassing etc., for example.

It applies to all the embodiments described herein that the entire package, the dimensions of which can be defined by the package lid 13 including the thickness of the substrate 10, comprises a structural height $H_G$ of $H_G=1$ mm or less. Alternatively or additionally, the measuring cavity 14 may comprise a structural clearance height $H_K$ of $H_K=1$ mm or less defined between the first main surface 11 of the substrate 10 and the package lid 13.

Alternatively or additionally, the surface area of the package defined by the package lid 13 on the first main surface 11 of the substrate 10 may be 8×4 mm$^2$ or less.

Alternatively or additionally, the micropump 15 may comprise lateral dimensions of 4×4 mm$^2$ or less.

It is true for all the embodiments described herein that a distance between the package lid 13 and the pump membrane arranged adjacent to the package lid 13 is approximately 20 μm or less. Thus, deflection of the pump membrane in the direction towards the package lid 13 can be ensured.

Figure 9:
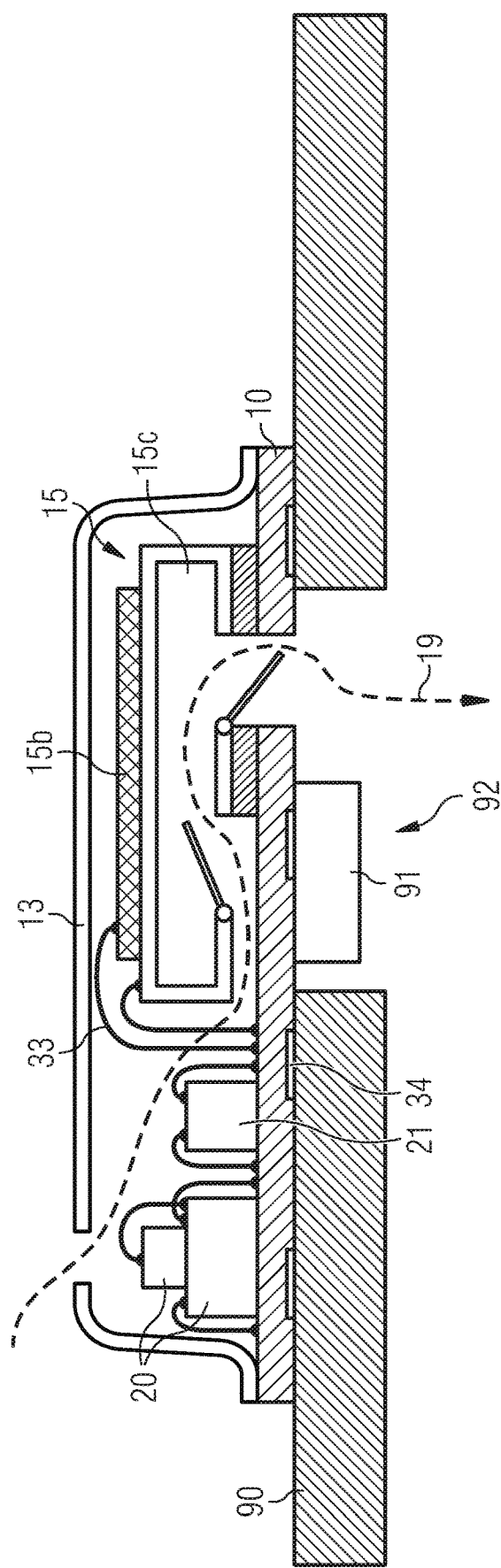
FIG. 9 is a schematic sectional side view of a combined pump-sensor arrangement in accordance with another embodiment.

FIG. 9 shows another example of a combined pump-sensor arrangement 100. This embodiment basically corresponds to the embodiment discussed before referring to FIG. 3, with the difference that the combined pump-sensor arrangement 100 is arranged on a system substrate 90. Exemplarily, the combined pump-sensor arrangement 100 can be arranged on the system substrate 90 with the second main surface 12 of the substrate 10.

The system substrate 90 may comprise one or several recesses 92 through which the second main surface 12 of the substrate 10 is exposed. Thus, one or several further components 92 can be arranged on the second main surface 12 of the substrate 10 through this recess 92.

The recess 92 may alternatively or additionally be used for forming the fluid outlet and/or the fluid inlet, but also for accommodating further elements 91 which may be used for operating the sensor 20 or micropump 15.

The inventive combined pump-sensor arrangement 100 and the advantage thereof are to be summed up briefly below:

The concept described herein provides a solution of accommodating a micropump 15 and a sensor 20 in a package (like structural height $H_G \leq 1$ mm) so small that it can fit into mobile devices. Additionally, the surface area can be kept very small (exemplarily smaller than 8×4 mm$^2$), and it may be integrated into modern production lines so as to achieve the typical material costs of smartphones, for example (like length: sensor<3 mm, micropump roughly 4 mm, resulting in an overall length of 7 mm; width roughly 4 mm, height<1 mm).

The micropump 15 and the sensor 20 here are installed in the package together. There are several variations of open cavity packages as are, for example, also used for microphones:

a) Metal cap package 13 having an opening 22 and additional openings 23 in the substrate 10 used (like conductive circuit board or foil)
b) Plastic caps with or without metallization
c) "Open cavity molded packages"—plastic packages having an opening and further wafer-level package variations The invention has been described referring to the figures using the example of a metal cap package ("open metal lid LGA package").

The substrate 10 may, for example, be a polyimide foil with a dual-side metallization and via contacts.

Embodiments of the inventive concept provide for the micropump 15 to be mounted on the same substrate 10 as is the sensor 20 (or sensors) and the respective ASIC/evaluation chips 21. When including spacers 24, the micropump 15 can be put on (glued or soldered), which in turn allows defining and dimensioning fluid channels 25, 61.

The following advantages result when using the inventive combined pump-sensor arrangement 100:
1) No additional contact board required (height saving of approximately 150 µm).
2) Fluid guiding takes place within the package (open cavity package) and does not require any additional height.
3) Free movement of the pump membrane by approximately 15 µm towards the top is ensured.
4) The relatively high voltage at the piezo crystal 15b of approximately 60 to 80 Volts is housed in a contact-proof manner.
5) The suggested method fits in with existing and potential future methods for manufacturing miniaturized packages. Thus, it is suitable for production and competitive, wherein further cost reductions are possible
6) The structural height used by smartphone manufacturers of 1 mm can be complied with.
7) The dead volume (the volume to be pumped until the fluid to be measured reaches the sensor 20) can be minimized by additional passive volume filling materials 81 in the package.
8) The method allows using further sensors 21 which can then make use of the same evaluation chips.
9) Evaluation chips and processors for the sensor 20 and the micropump 15 can be commonly used, thereby saving space.

The dead volume for the fluid to be pumped in the package can additionally be reduced by inserting additional dummy elements made from plastics or different materials.

Additionally, the inventive combined pump-sensor arrangement 100 can be of particular advantage, in particular in chemical sensors which absorb gas molecules from the environment by means of an absorption layer. Conventional metal oxide sensors, for example, use a heating cycle in order to desorb absorbed gas molecules again and regenerate the metal oxide layer for a next absorption cycle. The desorbed molecules accumulate in the package of the sensor 20. In conventional sensors, the collected gas molecules are difficult to remove from the package 20 by means of diffusion. The inventive combined pump-sensor arrangement 100, in contrast, replaces diffusion by convection. Thus, the accumulated gas molecules can be removed readily from the package.

The micropump 15 can either be glued or soldered to the substrate 10 in different ways.

Another option is effecting fluid inflow via a bottom opening in the substrate, in analogy to the fluid outlet.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A combined pump-sensor arrangement comprising:
a substrate comprising a first main surface and an opposite second main surface,
a cap-shaped lid of a package, the lid being arranged on the first main surface of the substrate, wherein the lid forms a hollow that defines a hollow measuring cavity,
a micropump comprising a pump inlet and a pump outlet, the micropump being configured to suck in an analyte fluid present in the measuring cavity through the pump inlet and eject the same to an environment outside the measuring cavity via the pump outlet,
a sensor for detecting at least one component of the analyte fluid present within the measuring cavity and movable by means of the micropump,
wherein both the sensor and the micropump are adjacently arranged on, and in direct contact with, the first main surface of the substrate, and
wherein the cap-shaped lid contactlessly covers the sensor and the micropump such that both the sensor and the micropump are each arranged inside the hollow measuring cavity formed by the cap-shaped lid.

2. The combined pump-sensor arrangement in accordance with claim 1, wherein the micropump is arranged on the first main surface of the substrate without any support.

3. The combined pump-sensor arrangement in accordance with claim 1, wherein the micropump is implemented without tubes.

4. The combined pump-sensor arrangement in accordance with claim 1, wherein the micropump is arranged to be spaced apart from the first main surface of the substrate by means of a spacer so that the result is a fluid channel between the micropump and the first main surface of the substrate, the fluid channel fluidically connecting to each other the measuring cavity and the pump inlet, wherein the analyte fluid can be sucked in through this fluid channel.

5. The combined pump-sensor arrangement in accordance with claim 1, wherein the substrate comprises a recess, arranged in the first main surface, defining a fluid channel between the measuring cavity and the pump inlet so that the analyte fluid can be sucked in through this fluid channel.

6. The combined pump-sensor arrangement in accordance with claim 1, wherein the lid comprises an opening defining a fluid inlet through which the analyte fluid may flow into the measuring cavity from the environment, the opening being arranged adjacent to the sensor.

7. The combined pump-sensor arrangement in accordance with claim 1, wherein the substrate comprises an opening extending completely through the substrate, the opening defining a fluid inlet through which the analyte fluid may flow into the measuring cavity from the environment, and wherein the sensor is arranged, in the fluid flow direction, between the fluid inlet and the pump inlet.

8. The combined pump-sensor arrangement in accordance with claim 1, wherein a filling material is arranged within the measuring cavity, the filling material filling at least a part of the overall volume of the measuring cavity so that the remaining volume of the measuring cavity where the analyte fluid may propagate is reduced by the portion of the filling material.

9. The combined pump-sensor arrangement in accordance with claim 8, wherein the filling material comprises a casting compound coating the measuring cavity, at least with the exception of a fluid flow path between an active sensor area of the sensor and the pump inlet.

10. The combined pump-sensor arrangement in accordance with claim 1, wherein the lid is arranged on the first main surface of the substrate in a fluid-tight manner.

11. The combined pump-sensor arrangement in accordance with claim 1, wherein the package comprises a structural height $H_G$ that does not exceed $H_G=1$ mm, and/or wherein the measuring cavity comprises an assembly space having a height $H_K$ measured between the first main surface of the substrate and the package lid, wherein said height does not exceed $H_K=1$ mm.

12. The combined pump-sensor arrangement in accordance with claim 1, wherein the surface area of the package defined by the package lid on the first main surface of the substrate does not exceed 8×4 mm².

13. The combined pump-sensor arrangement in accordance with claim 1, wherein the micropump comprises lateral dimensions that do not exceed 4×4 mm².

14. The combined pump-sensor arrangement in accordance with claim 1, wherein the micropump is implemented to be a MEMS (micro electro mechanical system) micropump.

15. The combined pump-sensor arrangement in accordance with claim 1, wherein the sensor is configured to detect at least a gas and/or solid particle and/or volatile organic compounds present in the analyte fluid.

* * * * *